United States Patent
Zheng et al.

(10) Patent No.: US 10,825,987 B2
(45) Date of Patent: Nov. 3, 2020

(54) FABRICATION OF ELECTRODES FOR MEMORY CELLS

(71) Applicant: Micron Technology, Inc., Boise, ID (US)

(72) Inventors: Pengyuan Zheng, Boise, ID (US); Yongjun J. Hu, Boise, ID (US); Yao Jin, Meridian, ID (US); Hongqi Li, Boise, ID (US); Andrea Gotti, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/001,795

(22) Filed: Jun. 6, 2018

(65) Prior Publication Data

US 2019/0378975 A1 Dec. 12, 2019

(51) Int. Cl.
*H01L 21/28* (2006.01)
*H01L 45/00* (2006.01)
*H01L 27/24* (2006.01)

(52) U.S. Cl.
CPC ........ *H01L 45/126* (2013.01); *H01L 27/2427* (2013.01); *H01L 27/2463* (2013.01);
(Continued)

(58) Field of Classification Search
CPC ....... H01L 45/126; H01L 45/16; H01L 45/06; H01L 45/1233; H01L 45/141;
(Continued)

(56) References Cited

U.S. PATENT DOCUMENTS

2008/0210923 A1 9/2008 Sato
2009/0257271 A1* 10/2009 Noshiro ............... H01L 27/101
365/148

(Continued)

FOREIGN PATENT DOCUMENTS

KR 20080023013 A 3/2008
KR 20100006680 A 1/2010

OTHER PUBLICATIONS

D'Alfonso, A.J. et al., "Depth Sectioning in Scanning Transmission Electron Microscopy Based on Core-Loss Spectroscopy", Ultramicroscopy, vol. 108, Issue 1, Dec. 2007, pp. 17-28.
(Continued)

*Primary Examiner* — Steven H Loke
*Assistant Examiner* — Samuel Park
(74) *Attorney, Agent, or Firm* — Holland & Hart LLP

(57) ABSTRACT

Methods, systems, and devices for fabrication of memory cells are described. An electrode layer may have an initial thickness variation after being formed. The electrode layer may be smoothened prior to forming additional layers of a memory cell, thus decreasing the thickness variation. The subsequent layer fabricated may have a thickness variation that may be dependent on the thickness variation of the electrode layer. By decreasing the thickness variation of the electrode layer prior to forming the subsequent layer, the subsequent layer may also have a decreased thickness variation. The decreased thickness variation of the subsequent layer may impact the electrical behavior of memory cells formed from the subsequent layer. In some cases, the decreased thickness variation of the subsequent layer may allow for more predictable voltage thresholds for such memory cells, thus increasing the read windows for the memory cells.

9 Claims, 5 Drawing Sheets

(52) U.S. Cl.
CPC .......... *H01L 45/06* (2013.01); *H01L 45/1233* (2013.01); *H01L 45/141* (2013.01); *H01L 45/16* (2013.01)

(58) Field of Classification Search
CPC . H01L 27/2463; H01L 27/2427; H01L 45/12; H01L 27/24; H01L 45/144; H01L 2224/131; H01L 21/3212; H01L 21/32133
See application file for complete search history.

(56) References Cited

U.S. PATENT DOCUMENTS

| | | | | |
|---|---|---|---|---|
| 2009/0279349 | A1* | 11/2009 | Shih | H01L 27/2436 365/163 |
| 2009/0289251 | A1* | 11/2009 | Kiyotoshi | H01L 27/1021 257/43 |
| 2010/0221896 | A1* | 9/2010 | Sandoval | H01L 45/04 438/478 |
| 2010/0227435 | A1* | 9/2010 | Park | B24B 37/015 438/102 |
| 2013/0069182 | A1* | 3/2013 | Ohsawa | H01L 29/82 257/421 |
| 2013/0224930 | A1* | 8/2013 | Arita | H01L 27/2409 438/382 |
| 2014/0241050 | A1* | 8/2014 | Nakai | H01L 45/06 365/163 |
| 2015/0004805 | A1* | 1/2015 | Omstead | H01L 21/02126 438/786 |
| 2015/0221701 | A1 | 8/2015 | Yang et al. | |
| 2015/0243885 | A1 | 8/2015 | Sciarrillo | |
| 2017/0244031 | A1* | 8/2017 | Jeong | H01L 45/04 |

OTHER PUBLICATIONS

Martin, Jean M. et al., "Chemical Bond Mapping of Carbon by Image-Spectrum EELS in the Second Derivative Mode", Ultramicroscopy, vol. 65, Issues 3-4, Oct. 1996, p. 229-238.

Nellist, Peter, "Electron-optical sectioning for three-dimensional imaging of crystal defect structures", Materials Science in Semiconductor Processing, 65 (2017) 18-23.

Stegmann, H. et al., "Advanced EELS Applications in Process Development", AMD Saxony LLC & Co. KG, Dresden, Germany, 39 pgs. 2005.

Xin, Huolin L., "Depth Sectioning of Individual Dopant Atoms with Aberration-Corrected Scanning Transmission Electron Microscopy", Applied Physics Letters, vol. 92 Issue 1, 2008.

ISA/KR, International Search Report and Written Opinion of the International Searching Authority, Int'l. Appl. No. PCT/US2019/033062, dated Sep. 26, 2019, Korean Intellectual Property Office, Seo-gu, Daejeon, Republic of Korea, 13 pgs.

* cited by examiner

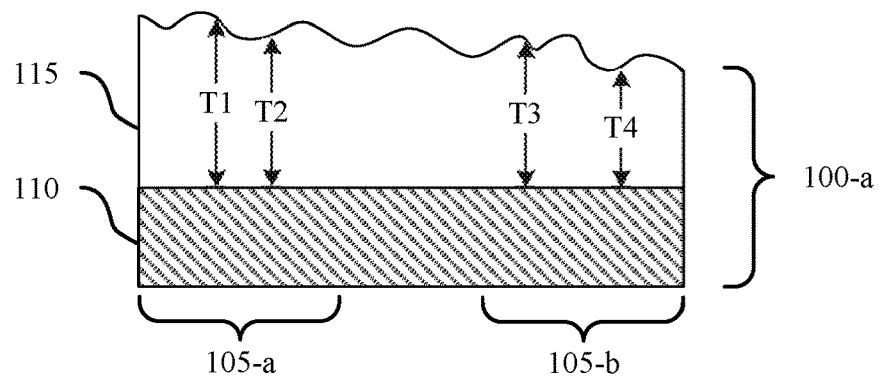
FIG. 1A
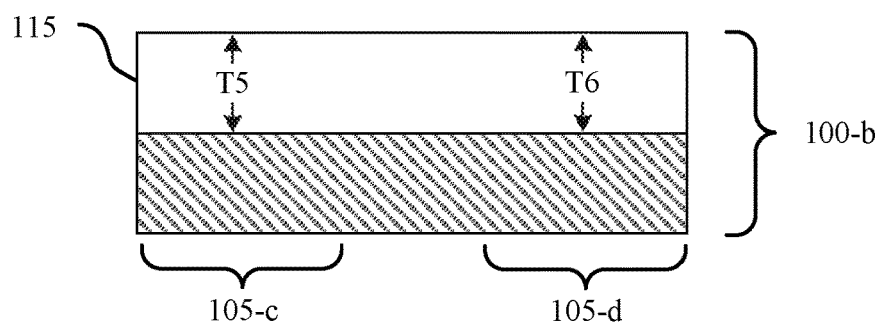
FIG. 1B
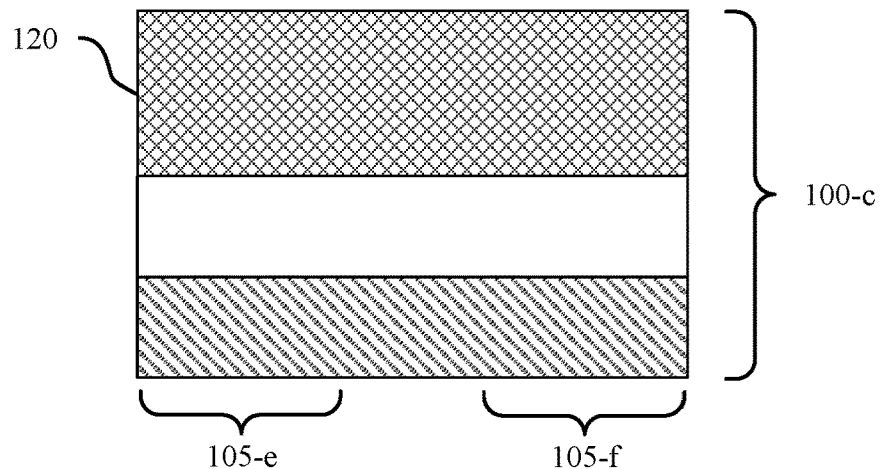
FIG. 1C
 Conductive Material     Electrode Material     Active Component Layer

FABRICATION OF ELECTRODES FOR MEMORY CELLS

BACKGROUND

The following relates generally to fabricating memory cells and more specifically to fabrication of electrodes for memory cells.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

In some memory devices, the electrical behavior of a memory cell (e.g., one or more threshold voltages of the memory cell) may depend at least in part on physical dimensions of the memory cell. Improved solutions for reducing variation in the physical dimensions and thus of the electrical behavior of memory cells associated with a memory device may be desired.

BRIEF DESCRIPTION OF THE DRAWINGS

FIGS. 1A through 1C illustrate examples of fabrication techniques in accordance with embodiments of the present disclosure.

DETAILED DESCRIPTION

Figure 2A:
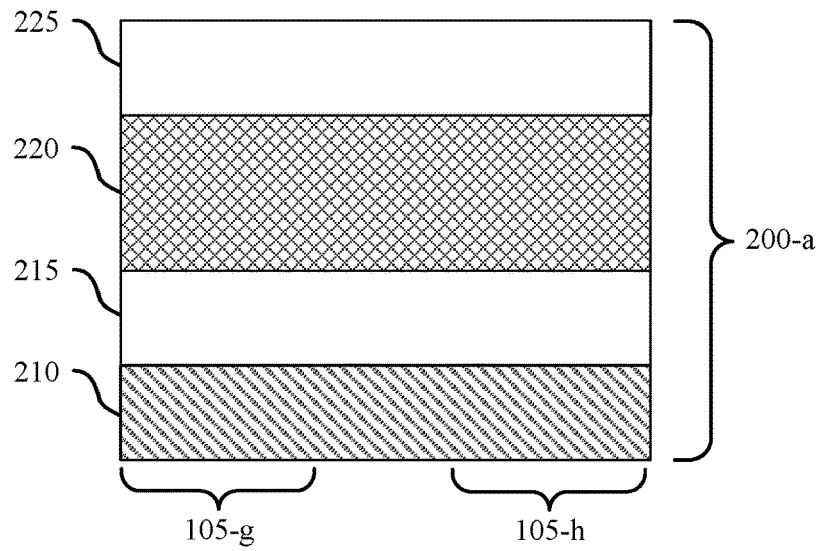
FIGS. 2A and 2B illustrate examples of fabrication techniques in accordance with embodiments of the present disclosure.

Some memory devices may be formed, at least in part, by forming a stack of various materials (e.g. a stack of materials may be formed and additional processing steps may be applied to the stack). In some cases, layers of the stack may be formed sequentially, and thus the formation of the stack may involve forming a second layer of the stack above or on top of a first, prior layer of the stack. The method of formation of the first layer may result in that layer having a rough surface and associated variations in thickness. If the second layer of the stack is formed in contact with the uneven first layer, the thickness variation of the first layer may propagate upwards to the next second layer, causing thickness variations in the second layer as well. The thickness variation may impact the behavior of one, both layers, and/or components. For example, the behavior of the material in a given layer as it is exposed to different voltages (e.g., a threshold voltage of the material or the layer) may depend on the thickness of that layer. It may therefore be desirable to minimize the thickness variation of a prior layer to maximize thickness uniformity in the subsequent layer.

In accordance with the teachings herein, fabricating a memory cell may include smoothening (e.g., polishing) a prior layer prior to forming a next layer. For example, a first electrode layer may be fabricated with techniques that result in thickness variations throughout the layer. In some cases, polishing the electrode layer prior to forming an active layer may decrease thickness variations in the electrode layer and consequently, the active layer. Because the electrode layer was polished prior to the active layer formation, the resulting active layer may have less thickness variation than had it been formed without an intermediate polishing step. Therefore, the active layer may have more predictable and uniform behavior. For example, the active layer may behave similarly across multiple memory cells when each memory cell is exposed to the same voltage (e.g., memory cells formed from the active layer may have more uniform threshold voltages). These and other fabrication techniques described herein may thus improve the behavior and performance of memory cells.

Features of the disclosure introduced above are further described below in the context of the example fabrication techniques of FIGS. 1A, 1B, 1C and FIGS. 2A, 2B. These and other features of the disclosure are further illustrated by and described with reference to the flowcharts of FIG. 3 through 5 that relate to fabrication of electrodes for memory cells.

FIGS. 1A-1C are schematic depictions of intermediate memory array structures illustrating a method of fabricating a memory cell stack with a smoothened electrode layer, depicted at various stages of fabrication.

Referring to intermediate array structure 100-a of FIG. 1A, according to some examples, region 105-a may include aspects of an array structure for a first memory cell stack and 105-b may include aspects of an array structure for a second memory cell stack. In some cases, the first memory cell stack and second memory cell stack may eventually be configured as (e.g., fabricated into) two distinct memory cells, and the data stored in the first memory cell may be independent of the data stored in the second memory cell. Although only two regions 105-a and 105-b are shown, one of ordinary skill will appreciate that, in practice, many regions may be formed.

In some cases, fabricating the memory cell stack may include forming a conductive material 110 over a substrate (not shown). Conductive material 110 may be used to form one or more access lines, for example a word line or a bit line for a memory cell corresponding to region 105-a and/or region 105-b.

The method may additionally include forming an electrode material 115 over the conductive material 110. Electrode material 115 may be used to form one or more electrodes (e.g., to couple an access line with an active component of a memory cell), for example electrodes respectively corresponding to region 105-a and region 105-b. Electrode material 115 may include carbon. In some cases, electrode material 115 may consist of two sub-layers (not shown), and thus may be referred to as a bi-layer electrode, where a first sub-layer is in contact with conductive material 110 and a second sub-layer is formed above the first sub-layer. In this case, the second, upper sub-layer may include carbon and may be referred to as a carbon-based material. Electrode material 115 may be formed, for example, by deposition techniques such as physical vapor deposition (PVD), chemical vaper deposition (CVD), or atomic layer deposition (ALD), among other deposition techniques. Each layer may be initially formed as a blanket layer over the surface area of an entire die or substrate, such as a wafer.

In some examples, deposition techniques used to form electrode material 115 (e.g., PVD, CVD, or ALD techniques) may result in the top (e.g., exposed) surface of electrode material 115 being undesirably rough, e.g., due to sputtering or other aspects of the relevant deposition techniques. The roughness of the top surface of electrode material 115 result in some portions of electrode material 115 having different thicknesses than other portions. For example, thickness T1 of electrode material 115 may be larger than thickness T2, which may be larger than thickness T3, which may be larger than thickness T4. The electrode material thickness T1-T4 thus may vary within a single memory stack region 105, or between different memory stack regions 105-a and 105-b. That is, in some cases, the thickness of electrode material 115 may be larger in one portion of region 105-a than in another portion of 105-b (i.e. T1>T2). In some other cases, the thickness of electrode material 115 may be larger in one region 105-a than in a different region 105-b (i.e. T1, T2>T3, T4).

Referring now to intermediate array structure 100-b of FIG. 1B, according to some examples, the method may include smoothening the electrode material 115. The smoothening process may smoothen the upper surface of electrode material 115 and thereby reduce thickness variations (and thus also increase thickness uniformity) within electrode material 115. In some cases, the smoothening process may decrease the thickness variations of electrode material 115 within a single memory stack region 105. For example, the thickness of electrode material 115 may be the same or substantially the same as thickness T5 throughout region 105-c, whereas the electrode material thickness of region 105-a prior to smoothening may have been more varied (i.e. thickness T1>thickness T2). The smoothening process may also decrease the variation of electrode material thickness between regions 105. For example, electrode material thickness of region 105-c T5 may be the same as or substantially the same as electrode material thickness T6 of region 105-d, whereas prior to smoothening, the thickness of electrode material 115 was larger in region 105-a then 105-b (i.e. T1, T2>T3, T4).

The smoothening process may involve polishing electrode material 115 using, for example, chemical-mechanical planarization (CMP). In some cases, intermediate array structure 100-a may undergo a CMP process to form intermediate array structure 100-b. For example, the top surface of electrode material 115 may be polished using CMP to form the electrode material 115 layer of intermediate array structure 100-b. The polishing process may not change the bulk properties of the electrode material layer 115. For example, relevant properties of electrode material layer 115 may remain unchanged as a result of the polishing process. That is, electrode material layer 115 may behave similarly when exposed to different voltages and currents after a CMP process as electrode material layer 115 would have behaved without the CMP process. In some examples, performing CMP may involve breaking the vacuum seal that may be associated with a fabrication process used to form electrode material layer 115 (e.g., a PVD, CVD, or ALD process), which may, at least for some period of time, expose the top (e.g., exposed) surface of electrode material 115 to oxygen. The lack of the vacuum seal may thus result in an oxidation occurring at the electrode material 115 layer of the intermediate array structure 100-b. Additionally or alternatively, the CMP process itself may result in oxidation occurring at the electrode material 115 layer of the intermediate array structure 100-b. Thus, in some cases, the electrode material 115 layer may eventually comprise oxidized carbon.

Referring to intermediate array structure 100-c of FIG. 1C, according to some examples, fabricating the memory cell stack may additionally include forming an active component layer 120 over the polished electrode material 115. In some examples, active component layer 120 may be used to form one or more selector components (e.g., selector diodes) or storage components. In some cases, oxidation of electrode material 115 layer may be localized or more extensive at or near the surface of electrode material 115 layer nearest (e.g., in contact with) an active component layer 120.

In some cases, the thickness uniformity of active component layer 120 may be due to the polishing of electrode material 115. That is, any thickness variation of electrode material 115 may result in an inverse thickness variation in active component layer 120. For example, if electrode material 115 is thicker in region 105-e than in region 105-f, active component layer 120 may be thinner in region 105-e than in region 105-f.

Active component layer 120 may be formed of a chalcogenide material. In cases where the chalcogenide material of active component layer 120 is used to form one or more selector components, the chalcogenide material of active component layer 120 may be maintained in an amorphous state but may be in a high-resistance state (e.g., an insulating state) when a voltage differential across the chalcogenide material is below a threshold magnitude and may be in a low-resistance state (e.g., a conductive state) when the voltage differential across the chalcogenide material is at or above the threshold magnitude. In such cases, the threshold magnitude may comprise a switching threshold voltage for the chalcogenide material of active component layer 120.

In cases where the chalcogenide material of active component layer 120 is used to form one or more storage components, the chalcogenide material of active component layer 120 may transition between amorphous and crystalline states. In some cases, there may be a large resistance contrast in active component layer 120 when active component layer 120 is in a crystalline state versus an amorphous state. A material in the crystalline state may have atoms arranged in a periodic structure, which may result in a relatively low electrical resistance (e.g., set state). By contrast, material in an amorphous state may have no or relatively little periodic atomic structure, which may have a relatively high electrical resistance (e.g., reset state). The difference in resistance values between amorphous and crystalline states of a material may be significant; for example, a material in an amorphous state may have a resistance one or more orders of magnitude greater than the resistance of the material in its crystalline state.

In some cases where the chalcogenide material of active component layer 120 is used to form one or more storage components, to set a region 105 of active component layer 120 to a low-resistance state, the region 105 may be heated by passing a current through the region 105. Heating a region 105 of active component layer 120 to an elevated temperature (but below its melting temperature) may result in the region 105 of active component layer 120 crystallizing and forming the low-resistance state. The current may result from applying a voltage to the region 105, where the applied voltage is based on a first threshold voltage for the region 105. For example, if the region 105 is in a reset state, current may not flow through the region 105 unless the applied voltage is greater than the first threshold voltage.

In some other cases where the chalcogenide material of active component layer 120 is used to form one or more storage components, to set a region 105 of active component layer 120 to a high-resistance state, the region 105 may be heated above its melting temperature. A region 105 of the active component layer 120 may be switched from the crystalline state to the amorphous state by setting the voltage across the region 105 of active component layer 120 (and thus the current through the region 105 of active component layer 120) to a second threshold voltage, which may increase the temperate of the chalcogenide material beyond a melting temperature, and then removing the voltage/current sufficiently abruptly (e.g., applying the voltage/current for only a relatively brief temporal duration such that crystallization does not occur).

The switching threshold voltage of active component layer 120 when used to form one or more selector components, as well as the first and second threshold voltages of active component layer 120, corresponding to a set voltage and a reset voltage of the material of active component layer 120 when used to form one or more storage components, may depend on the thickness of active component layer 120. That is, a larger thickness may correspond to larger threshold voltages. Additionally, in variations in thickness of active component layer 120 may result in corresponding variations in threshold voltage values. In some cases, it may be desirable to have precise threshold voltages for the entire active component layer 120. For example, it may be desirable for the threshold voltages within region 105-*e* to be consistent within the region 105-*e* as well as the threshold voltages within region 105-*e* to be similar to that of another region 105-*f*. That is, it may be desirable for the standard deviation of threshold voltages for active component layer 120 to be small. In cases where the chalcogenide material of active component layer 120 is used to form one or more selector components, threshold voltages with a small standard deviation may provide benefits such as improved reliability and improved design tolerances for a memory device. In cases where the chalcogenide material of active component layer 120 is used to form one or more storage components, threshold voltages with a small standard deviation may also provide benefits such as improved reliability and improved design tolerances for a memory device, including a larger or more reliably large window between the first threshold voltage and the second voltage (which may, for example, correspond to a read or write window of a memory cell that includes a region 105).

Figure 2B:
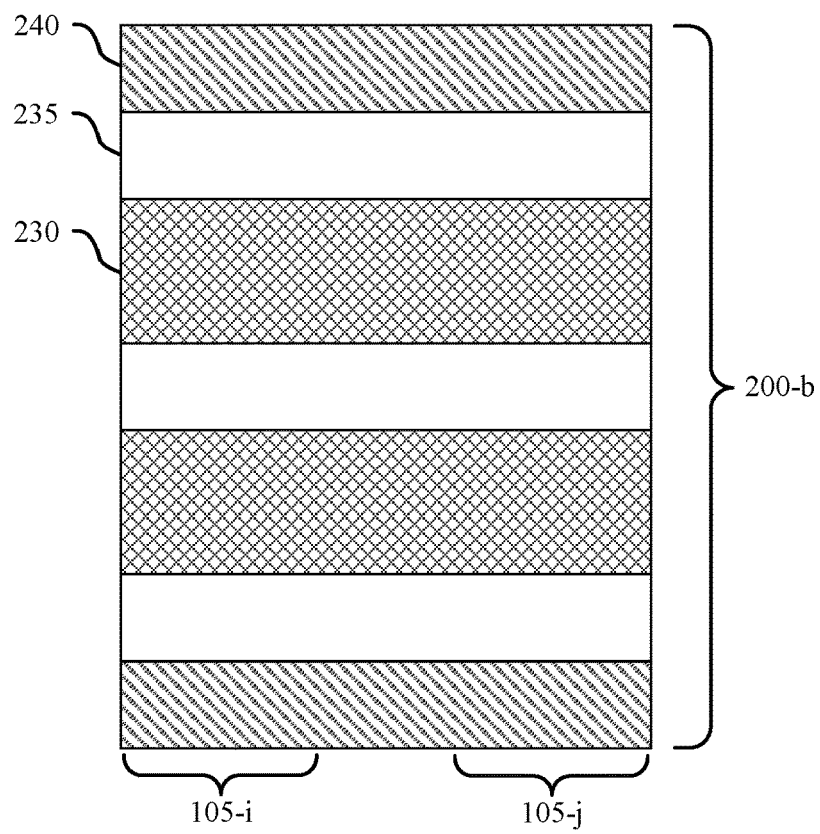

FIGS. 2A-2B are schematic depictions of additional intermediate memory array structures illustrating a method of fabricating a memory cell stack with a smoothened electrode layer, depicted at various stages of fabrication. The memory array structures shown in FIGS. 2A-2B may correspond to memory array structures as described with reference to FIGS. 1A-1C that have been subsequently processed with additional fabrication steps. For example, conductive material 110 of FIGS. 1A-1C may correspond to conductive material 210 of FIGS. 2A and 2B. Further, electrode material 115 of FIGS. 1A-1C may correspond to electrode material 215 of FIGS. 2A and 2B.

Referring to intermediate array structure 200-*a* of FIG. 2A, fabricating the memory cell stack may additionally include, according to some examples, forming a second electrode material 225 over the first active component layer 220. In some cases, the second electrode material 225 may be a carbon-based material. The second electrode material 225 may be formed using similar techniques as the first electrode material 215 (e.g., PVD, CVD, ALD). The techniques of formation for second electrode material 225 may or may not result in a thickness variation similar to the thickness variation of electrode material 115 as seen in intermediate array structure 100-*a* of FIG. 1A. That is, in some cases, the thickness of the second electrode material 225 when initially formed may vary within a single region 105 or between regions, for example between region 105-*g* and 105-*h*, which may respectively correspond to region 105-*a* and 105-*b* as described in reference to FIGS. 1A-1C.

Fabricating intermediate array structure 200-*a* may include an additional step of polishing electrode material 225, using CMP for example, to achieve a more uniform thickness. In this case, electrode material 225 may come to include oxidized carbon, as polishing intermediate array structure 200-*a* outside of a vacuum environment may expose the top of the second electrode material 225 to oxygen and/or the polishing process itself may introduce oxidation. In some other cases, fabricating the memory cell stack may not include the polishing of the second electrode material 225. In this case, the second electrode material 225 may not include oxidized carbon.

Referring to intermediate array structure 200-*b* of FIG. 2B, fabricating the memory cell stack may additionally include, according to some examples, forming a second active component layer 230 above the second electrode material 225. The thickness of the second active component layer 230 may be based on the thickness variation of the second electrode material 225. For example, if electrode material is thicker in region 105-*i* than in region 105-*j*, the second active component layer 230 may be thinner in region 105-*i* and thicker in region 105-*j*. Alternatively, if the thickness of the second electrode material 225 is uniform across regions 105, the thickness of the second active component layer 230 may also be uniform across regions 105.

In some examples, the second active component layer 230 may include a cell material to form, for example, one or more storage components or selector components for the memory cell. The second active component layer 230 may be formed of chalcogenide materials. In some cases, the second active component layer 230 may include the same chalcogenide materials as active component layer 220 shown in FIG. 2A. In some other examples, the second active component layer 230 may include different chalcogenide materials (e.g., may have a different stoichiometry) than active component layer 220.

Still referring to FIG. 2B, according to some examples, fabricating the memory cell stack may additionally include forming a third electrode material 235 above the second active component layer 230. The third electrode material 235 may be formed using techniques similar to the methods used to form electrode material 215 and 225 (e.g., PVD, CVD, ALD). In some cases, the formation technique for the electrode material 235 may result in a thickness variation and surface roughness similar to the thickness variation and surface roughness of electrode material 115 in FIG. 1A. Fabricating intermediate array structure 200-*b* may optionally include polishing the third electrode material 235 to reduce the thickness variation and thus surface roughness of the third electrode material 235. In the case of polishing the third electrode material 235, the third electrode material 235 may include oxidized carbon as a result of polishing intermediate array structure 200-b in a non-vacuum environment, either due to oxygen exposure associated with breaking a vacuum seal or due to the polishing process itself. In some other cases, fabricating the memory cell stack may not include the polishing of the third electrode material 235. In this case, the third electrode material 235 may not include oxidized carbon. Thus, a memory device fabricated in accordance with the techniques described herein may include layers that comprise carbon (e.g., carbon electrode layers), and all or any subset of such carbon-based layers may exhibit oxidation. Further such oxidation may be localized or more extensive at or near a polished surface, which may also be a surface exposed to oxygen in connection with a polishing or other smoothening process.

Again referring to FIG. 2B, fabricating intermediate array structure 200-b may include forming a second conductive material 240 above the third electrode material 235. The second conductive material 240 may be used to form one or more access lines, for example a bit line or a word line for a memory cell corresponding to region 105-g and/or region 105-h.

In some cases, the method of formation may optionally include etching a space between region 105-i and 105-j in layers 220, 225, 230, and 235. This may create distinct memory cells in regions 105-i and 105-j. However, in the case where the space between region 105-i and 105-j is not etched, the two regions 105 may still create distinct memory cells. For example, a voltage applied to active component 230 in region 105-i may not sufficiently propagate through the material of active component 230 so as to disturb (e.g., corrupt) the logic state stored in region 105-j.

Also, in some examples, the second electrode layer (comprising second electrode material 225) and second active component layer 230 may be omitted, and the active component layer 120 may be configured as a storage element for a self-selecting memory cell.

In some cases, conductive material 110 or 210 may be smoothened prior to fabrication of an additional layer (e.g., electrode material 115 or 215). The smoothening of conductive material 110 and/or 210 may reduce thickness variations of the conductive material thus resulting in a corresponding thickness variation reduction of any subsequently formed layers thereupon, such as layers comprising electrode material 115 or 215. Further, in some other cases, one or more of active component layer 120 or active component layer 230 may be smoothened prior to fabrication an additional layer thereon (e.g., prior to fabricating second electrode layer 225 and/or prior to fabricating third electrode layer 235). Such additional smoothing of an additional surface of active component layer 120 and/or active component layer 230 (e.g., an upper surface, whereby a lower surface is smoothened as a result of smoothing an immediately lower layer) may further reduce variation in the thickness of the active component layer, within a region 105 or across regions 105, and thus may further reduce variation in one or more threshold voltages of the active component layer (e.g., for set or reset), within a region 105 or across regions 105. Where smoothing of a surface of active component layer 120 or active component layer 230 comprises application of a CMP process, contamination (e.g., chemical contamination) of the active component layer may occur, depending on details of the CMP process, which may present a tradeoff relative to a marginal increase in thickness uniformity.

While not shown for clarity and ease of illustration, it will be understood that the illustrated array structures may be formed above or below other layers (e.g., over a substrate), which can include, among other things, various peripheral and supporting circuitry, for instance complementary metal oxide semiconductor (CMOS) transistors that form a part of column and row driver circuitry and sense amplifier circuitry, as well as sockets and wiring that connect such circuitry to the memory array through the columns and rows described above. In addition, the other layers may include one or more memory arrays, or "decks" of arrays—the structures illustrated in the examples of FIGS. 1A, 1B, 1C and 2A, 2B may correspond to one deck of a memory array, and may be above or below any number of additional decks of the memory array.

Figure 3:
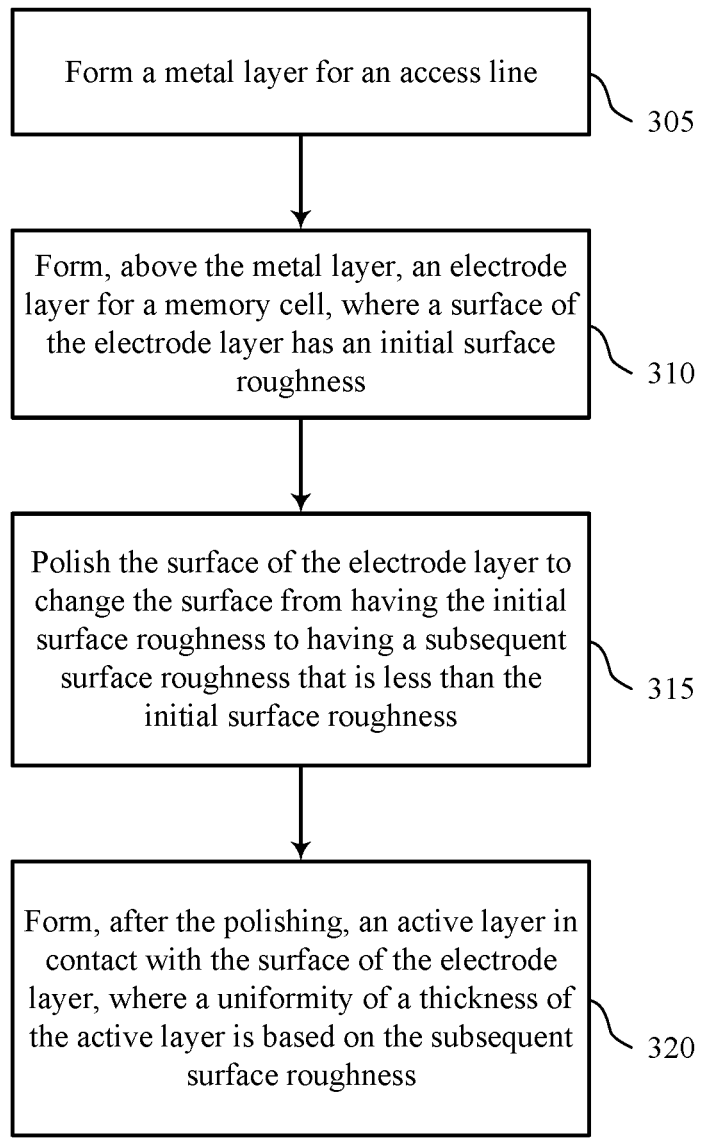
FIGS. 3 through 5 illustrate methods for the fabrication of memory cells in accordance with embodiments of the present disclosure.

FIG. 3 shows a flowchart illustrating a method 300 for fabrication of electrodes for memory cells in accordance with embodiments of the present disclosure. The operations of method 300 may be implemented in accordance with various fabrication techniques as described herein. For example, the operations of method 300 may be implemented by the fabrication techniques as discussed with reference to FIGS. 1 and 2.

At 305 a metal layer for an access line may be formed. The operations of 305 may be performed according to the methods described herein. In certain examples, aspects of the operations of 305 may be performed using the fabrication techniques discussed with reference to FIGS. 1 and 2.

At 310 an electrode layer for a memory cell may be formed above the metal layer. In some examples, a surface of the electrode layer has an initial surface roughness. In some examples, the electrode layer may be formed by deposing the electrode material via a deposition process. The operations of 310 may be performed according to the methods described herein. In certain examples, aspects of the operations of 310 may be performed using the fabrication techniques discussed with reference to FIGS. 1 and 2.

At 315 the surface of the electrode layer may be polished. In some examples, the polishing may change the surface from having the initial surface roughness to having a subsequent surface roughness that is less than the initial surface roughness. In certain examples, the polishing may be done by applying a CMP process to the surface of the electrode layer. In some cases, polishing the surface of the electrode layer may include breaking a vacuum seal associated with the deposition process. The operations of 315 may be performed according to the methods described herein. In certain examples, aspects of the operations of 315 may be performed using the fabrication techniques discussed with reference to FIGS. 1 and 2.

At 320 an active layer may be formed after the polishing. In some examples, the active layer may be in contact with the surface of the electrode layer. The uniformity of a thickness of the active layer may be based on the subsequent surface roughness. The operations of 320 may be performed according to the methods described herein. In certain examples, aspects of the operations of 320 may be performed using the fabrication techniques discussed with reference to FIGS. 1 and 2.

In some examples, an apparatus may perform aspects of the fabrication described above using general- or special-purpose hardware. The apparatus may include features, means, or instructions for forming the metal layer for the access line. The apparatus may further include features, means, or instructions for forming, above the metal layer, an electrode layer for a memory cell, where a surface of the electrode layer has an initial surface roughness. The apparatus may also include features, means, or instructions for polishing the surface of the electrode layer to change the surface from having the initial surface roughness to having a subsequent surface roughness that is less than the initial surface roughness. The apparatus may additionally include features, means, or instructions for forming, after the polishing, an active layer in contact with the surface of the electrode layer, where a uniformity of a thickness of the active layer is based on the subsequent surface roughness.

In some examples of the method and apparatus described above, polishing the surface of the electrode layer may include applying a CMP process to the surface of the electrode layer. In some examples of the method and apparatus, forming the electrode layer may include depositing an electrode material via a deposition process. In some cases, polishing the surface of the electrode layer may include breaking a vacuum seal associated with the deposition process.

Some examples of the method and apparatus described above may further include processes, features, means, or instructions for forming a second electrode layer for the memory cell above the active layer. Some examples of the method and apparatus described above may further include processes, features, means, or instructions for forming a second active layer above the second electrode layer. Some examples of the method and apparatus described above may further include processes, features, means, or instructions for polishing a surface of the second electrode layer before forming the second active layer to change the surface of the second electrode layer from a second initial surface roughness to a second subsequent surface roughness that may be less than the second initial surface roughness.

Some examples of the method and apparatus described above may further include processes, features, means, or instructions for polishing a surface of the active layer before forming the second electrode layer. Some examples of the method and apparatus described above may further include processes, features, means, or instructions for polishing a surface of the second active layer. In some examples of the method and apparatus described above, a storage component for the memory cell comprises at least a portion of the second active layer. In some examples of the method and apparatus described above, the active layer may include a first chalcogenide material. In some examples, the second active layer may include a second chalcogenide material, the second chalcogenide material different from the first chalcogenide material. In some examples of the method and apparatus described above, the electrode layer and the second electrode layer each comprise carbon.

Some examples of the method and apparatus described above may further include processes, features, means, or instructions for forming a third electrode layer for the memory cell above the second active layer. Some examples of the method and apparatus described above may further include processes, features, means, or instructions for forming a second metal layer for a second access line for the memory cell, the second metal layer above the third electrode layer. Some examples of the method and apparatus described above may further include processes, features, means, or instructions for polishing a surface of the third electrode layer prior to forming the second metal layer.

Figure 4:
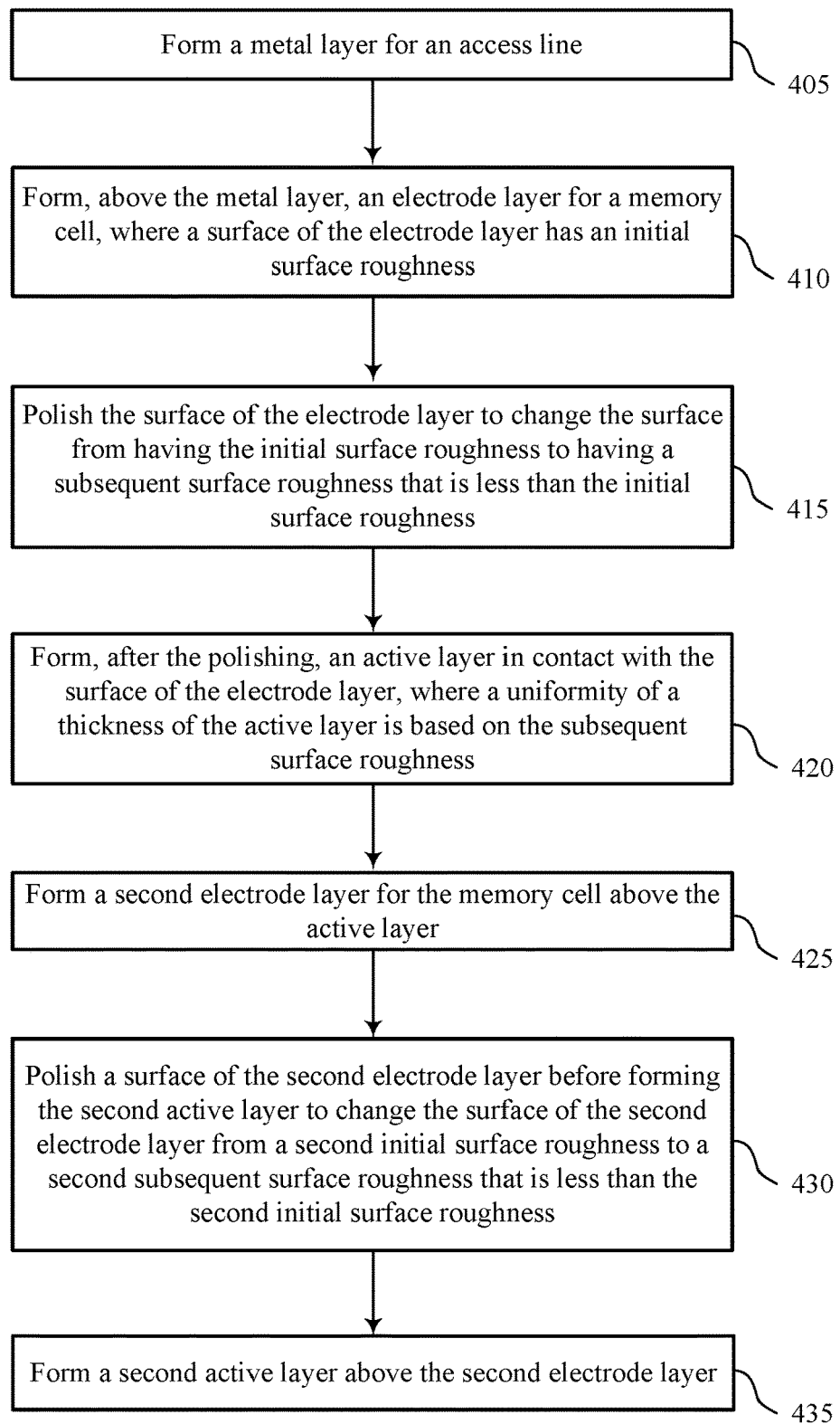

FIG. 4 shows a flowchart illustrating a method 400 for fabrication of electrodes for memory cells in accordance with embodiments of the present disclosure. The operations of method 400 may be implemented in accordance with various fabrication techniques as described herein. For example, the operations of method 400 may be implemented by the fabrication techniques as discussed with reference to FIGS. 1 and 2.

At 405 a metal layer for an access line may be formed. The operations of 405 may be performed according to the methods described herein. In certain examples, aspects of the operations of 405 may be using the fabrication techniques discussed with references to FIGS. 1A, 1B, 1C and 2A, 2B.

At 410 an electrode layer for a memory cell may be formed above the metal layer. In some examples, a surface of the electrode layer has an initial surface roughness. The operations of 410 may be performed according to the methods described herein. In certain examples, aspects of the operations of 410 may be performed using the fabrication techniques discussed with reference to FIGS. 1A, 1B, 1C and 2A, 2B.

At 415 the surface of the electrode layer may be polished. In some examples, the polishing may change the surface from having the initial surface roughness to having a subsequent surface roughness that is less than the initial surface roughness. In certain examples, the polishing may be done by applying a CMP process to the surface of the electrode layer. The operations of 415 may be performed according to the methods described herein. In certain examples, aspects of the operations of 415 may be performed using the fabrication techniques discussed with reference to FIGS. 1 and 2.

At 420 an active layer may be formed after the polishing. In some examples, the active layer may be in contact with the surface of the electrode layer. The uniformity of a thickness of the active layer may be based on the subsequent surface roughness. The operations of 420 may be performed according to the methods described herein. In certain examples, aspects of the operations of 420 may be performed using the fabrication techniques discussed with reference to FIGS. 1 and 2.

At 425 a second electrode layer for the memory cell may be formed above the active layer. The operations of 425 may be performed according to the methods described herein. In certain examples, aspects of the operations of 425 may be performed using the fabrication techniques discussed with reference to FIGS. 1 and 2.

At 430 a surface of the second electrode layer may be polished before forming the second active layer. In some examples, polishing the surface of the second electrode layer may change the surface of the second electrode layer from a second initial surface roughness to a second subsequent surface roughness that is less than the second initial surface roughness. The operations of 430 may be performed according to the methods described herein. In certain examples, aspects of the operations of 430 may be performed using the fabrication techniques discussed with reference to FIGS. 1 and 2.

At 435 the second active layer may be formed above the second electrode layer. The operations of 435 may be performed according to the methods described herein. In certain examples, aspects of the operations of 435 may be performed using the fabrication techniques discussed with reference to FIGS. 1 and 2.

Figure 5:
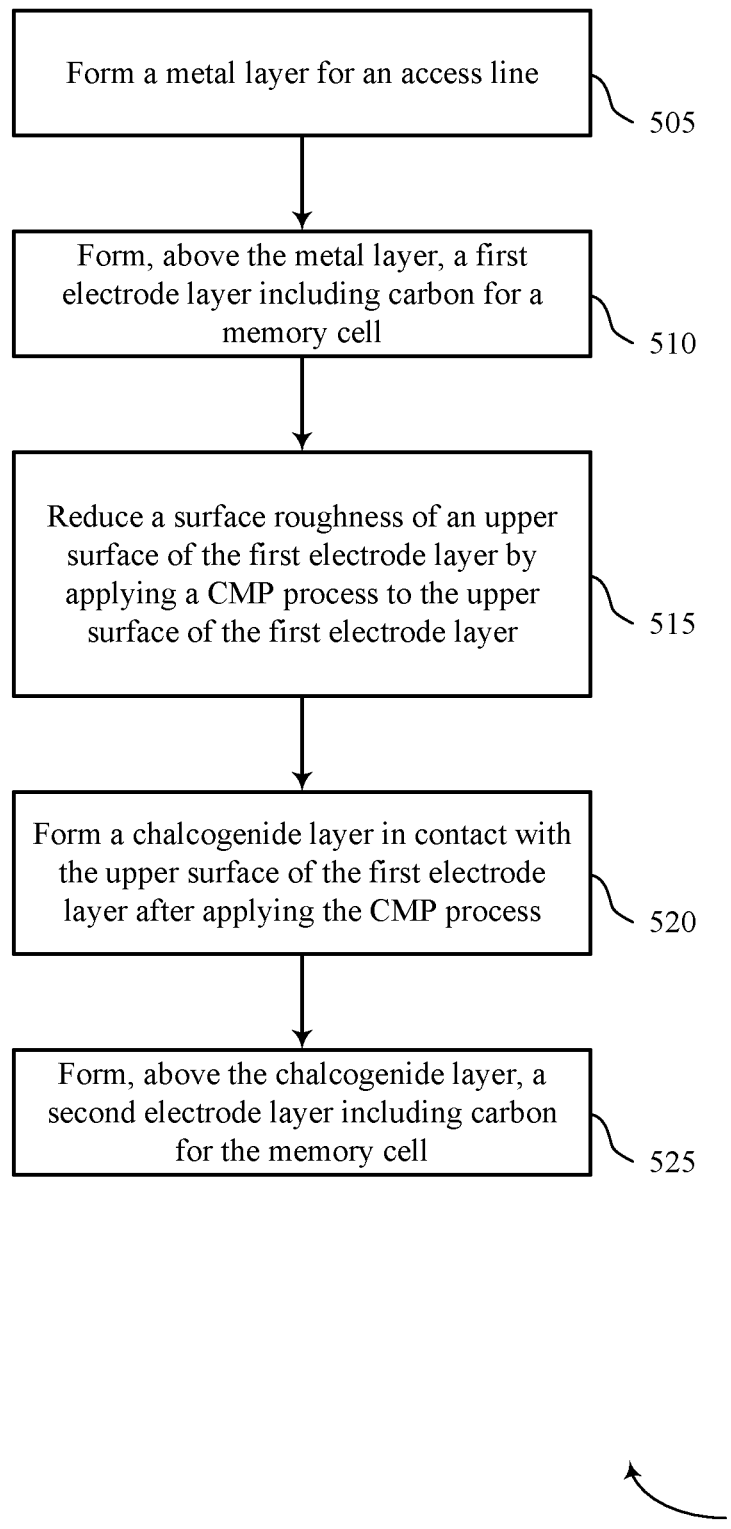

FIG. 5 shows a flowchart illustrating a method 500 for fabrication of electrodes for memory cells in accordance with embodiments of the present disclosure. The operations of method 500 may be implemented in accordance with various fabrication techniques as described herein. For example, the operations of method 500 may be implemented by the fabrication techniques as discussed with references to FIGS. 1A, 1B, 1C and 2A, 2B.

At 505 a metal layer for an access line may be formed. The operations of 505 may be performed according to the methods described herein. In certain examples, aspects of the operations of 505 may be performed using the fabrication techniques as discussed with reference to FIGS. 1A, 1B, 1C and 2A, 2B.

At 510 a first electrode layer comprising carbon may be formed above the metal layer. In some cases, the first electrode layer may be for a memory cell. In some examples, forming the first electrode layer may include depositing an electrode material via a deposition process. The operations of 510 may be performed according to the methods described herein. In certain examples, aspects of the operations of 510 may be performed using the fabrication techniques as discussed with reference to FIGS. 1A, 1B, 1C and 2A, 2B.

At 515 the surface roughness of an upper surface of the first electrode layer may be reduced. In some examples, the upper surface roughness may be reduced by applying a CMP process to the upper surface of the first electrode layer. In some other examples, applying the CMP process to the upper surface of the first electrode layer may include breaking a vacuum seal associated with the deposition process. The operations of 515 may be performed according to the methods described herein. In certain examples, aspects of the operations of 515 may be performed by using the fabrication techniques as discussed with reference to FIGS. 1A, 1B, 1C and 2A, 2B.

At 520 a chalcogenide layer may be formed in contact with the upper surface of the first electrode layer after applying the CMP process. The operations of 520 may be performed according to the methods described herein. In certain examples, aspects of the operations of 520 may be performed using the fabrication techniques as discussed with reference to FIGS. 1A, 1B, 1C and 2A, 2B.

At 525 a second electrode layer comprising carbon may be formed above the chalcogenide layer. In some examples, the second electrode layer may be for the memory cell. The operations of 525 may be performed according to the methods described herein. In certain examples, aspects of the operations of 525 may be performed using the fabrication techniques as discussed with reference to FIGS. 1A, 1B, 1C and 2A, 2B.

In some examples, an apparatus may perform aspects of the fabrication described using general- or special-purpose hardware. The apparatus may include features, means, or instructions for forming a metal layer for an access line and form, above the metal layer, a first electrode layer comprising carbon for a memory cell. The apparatus may additionally include features, means, or instructions for reducing a surface roughness of an upper surface of the first electrode layer by applying a CMP process to the upper surface of the first electrode layer. The apparatus may further include features, means, or instructions for forming a chalcogenide layer in contact with the upper surface of the first electrode layer after applying the CMP process and form, above the chalcogenide layer, a second electrode layer comprising carbon for the memory cell.

Some examples of the method and apparatus described above may further include processes, features, means, or instructions for reducing a surface roughness of an upper surface of the second electrode layer by applying a second CMP process to the upper surface of the second electrode layer. Some examples of the method and apparatus described above may further include processes, features, means, or instructions for forming a second chalcogenide layer in contact with the upper surface of the second electrode layer, where a thickness of the second chalcogenide layer may be based on reducing the surface roughness of the upper surface of the second electrode layer. Some examples of the method and apparatus described above may further include processes, features, means, or instructions for forming a second chalcogenide layer in contact with the upper surface of the second electrode layer, where a thickness of the second chalcogenide layer may be based on an initial surface roughness of the upper surface of the second electrode layer.

It should be noted that the methods described above describe possible implementations, and that the operations and the steps may be rearranged or otherwise modified and that other implementations are possible. Further, embodiments from two or more of the methods may be combined.

In some cases, a device, system, or apparatus fabricated in accordance with various fabrication techniques as described herein may include a first access line for a memory cell, a first electrode for the memory cell, the first electrode disposed above the first access line and comprising oxidized carbon, and an active component for the memory cell, the active component in contact with the first electrode and comprising chalcogenide.

In some examples of the device, system, or apparatus described above, the oxidized carbon may be oxidized based at least in part on a CMP process associated with the first electrode. In some cases, the oxidized carbon may be oxidized based at least in part on breaking a vacuum seal in association with the CMP process or based at least in part on the CMP process itself. In some examples of the device, system, or apparatus described above, the active component for the memory cell may include a selection component, a storage component, or a combination thereof the memory cell.

In some examples, the device, system, or apparatus may further include a second electrode for the memory cell. The device, system, or apparatus may also include a second active component for the memory cell, where the second active component may be in contact with the second electrode and may comprise chalcogenide. In some examples, the first electrode may have a first surface in contact with the active component, the first surface having a first roughness. Further, the second electrode may include a second surface in contact with the second active component, where the second surface has a second roughness that may be greater than the first roughness.

In some cases of the device, system, or apparatus described above, the active component may comprise a first chalcogenide material. In some examples, the second active component may comprise a second chalcogenide material, where the second chalcogenide material may be different from the first chalcogenide material. In some other examples, the active component and the second active component may comprise a same chalcogenide material. In some examples, the second electrode may include oxidized carbon. In some cases, the first electrode comprises two sub-layers, where the sublayer that is in contact with the active component may comprise carbon.

In some cases, the device, system, or apparatus described above may include a third electrode for the memory cell, the third electrode in contact with the second active component. The device, system, or apparatus may further include a second access line for the memory cell. In some examples, the third electrode may include oxidized carbon.

The term "coupled" refers to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals on a circuit being energized. By way of example, two components physically connected via a switch (e.g., a transistor) may be coupled regardless of the state of the switch (i.e., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory arrays.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   forming a first metal layer over an entire area of a die, wherein the first metal layer subsequently forms a plurality of access lines;
   forming, above the first metal layer, a first electrode layer over the entire area of the die, wherein the first electrode layer is for a plurality of memory cells, wherein an upper surface of the first electrode layer has a first initial surface roughness, and wherein a first portion of the first electrode layer associated with a first memory cell of the plurality of memory cells has a first thickness after the forming and a second portion of the first electrode layer associated with a second memory cell of the plurality of memory cells has a second thickness after the forming that is different than the first thickness;

polishing the upper surface of the first electrode layer formed over the entire area of the die to change the upper surface from having the first initial surface roughness to having a first subsequent surface roughness that is less than the first initial surface roughness, wherein the first portion of the first electrode layer associated with the first memory cell has a third thickness after the polishing and the second portion of the first electrode layer associated with the second memory cell has a fourth thickness after the polishing, and wherein a second difference between the third thickness and the fourth thickness is less than a first difference between the first thickness and the second thickness; and forming, after the polishing, a first active layer in contact with the upper surface of the first electrode layer, wherein a uniformity of a thickness of the first active layer is based at least in part on the first subsequent surface roughness.

2. The method of claim 1, wherein polishing the upper surface of the first electrode layer comprises:
applying a chemical-mechanical planarization (CMP) process to the upper surface of the first electrode layer.

3. The method of claim 1, wherein:
forming the first electrode layer comprises depositing an electrode material via a deposition process; and
polishing the upper surface of the first electrode layer comprises breaking a vacuum seal associated with the deposition process.

4. The method of claim 1, further comprising:
forming a second electrode layer above the first active layer; and
forming a second active layer above the second electrode layer.

5. The method of claim 4, further comprising:
polishing an upper surface of the second electrode layer before forming the second active layer to change the upper surface of the second electrode layer from having a second initial surface roughness to having a second subsequent surface roughness that is less than the second initial surface roughness.

6. The method of claim 4, further comprising:
polishing an upper surface of the first active layer before forming the second electrode layer; or
polishing an upper surface of the second active layer.

7. The method of claim 4, wherein a storage component comprises at least a portion of the second active layer.

8. The method of claim 4, wherein:
the first active layer comprises a first chalcogenide material;
the second active layer comprises a second chalcogenide material, wherein the second chalcogenide material is different from the first chalcogenide material; and
the first electrode layer and the second electrode layer each comprise carbon.

9. The method of claim 4, further comprising:
forming a third electrode layer above the second active layer;
forming a second metal layer for a second access line, the second metal layer above the third electrode layer; and
polishing a surface of the third electrode layer prior to forming the second metal layer.

* * * * *